(12) United States Patent
Kuhn et al.

(10) Patent No.: US 6,525,394 B1
(45) Date of Patent: Feb. 25, 2003

(54) SUBSTRATE ISOLATION FOR ANALOG/DIGITAL IC CHIPS

(76) Inventors: Ray E. Kuhn, 6271 Sage Dr., Macungie, PA (US) 18062; David G. Martin, 4618 Lenox Dr., Bethlehem, PA (US) 18017; Rose E. Williams, 4642 Werleys Corner Rd., New Tripoli, PA (US) 18066

( * ) Notice: Subject to any disclaimer, the term of this patent is extended or adjusted under 35 U.S.C. 154(b) by 31 days.

(21) Appl. No.: 09/631,862

(22) Filed: Aug. 3, 2000

(51) Int. Cl.[7] ............... H01L 29/00; H01L 29/76; H01L 29/94; H01L 31/062; H01L 31/113
(52) U.S. Cl. ............... 257/509; 257/371; 257/499; 257/544; 257/500
(58) Field of Search ............... 257/499, 500, 257/508, 509, 536, 544, 371, 373, 374, 493–513

(56) References Cited

U.S. PATENT DOCUMENTS

| | | | | | |
|---|---|---|---|---|---|
| 5,159,207 A | * | 10/1992 | Pavline et al. | ........... | 207/296.2 |
| 5,602,416 A | * | 2/1997 | Zambrano | ........... | 257/500 |
| 5,627,399 A | * | 5/1997 | Fujii | ........... | 257/501 |
| 5,990,535 A | * | 11/1999 | Palara | ........... | 257/500 |

* cited by examiner

*Primary Examiner*—Eddie Lee
*Assistant Examiner*—Jesse A. Fenty
(74) *Attorney, Agent, or Firm*—Peter V. D. Wilde

(57) ABSTRACT

The specification describes techniques for isolating noisy subcircuits in integrated analog/digital devices. Isolation is obtained using a modification of triple well isolation wherein the deep isolation implant is restricted to the digital circuits only to prevent noise from the digital circuits from propagating to the analog sections through the buried implant. Resistor sections are also separated from the buried isolation implant.

8 Claims, 3 Drawing Sheets

SUBSTRATE ISOLATION FOR ANALOG/DIGITAL IC CHIPS

FIELD OF THE INVENTION

This invention relates to integrated circuit devices with mixed signal components, e.g. analog and digital sections in the same IC substrate.

BACKGROUND OF THE INVENTION

Isolation of electrical signals in IC devices has been addressed in the prior art, and a variety of approaches have been developed. Complete isolation has been achieved in power ICs with dielectrically isolated structures. This approach is effective, but costly, and it consumes significant chip area. Junction isolation, i.e. guard rings, is the technique of choice in densely packed VLSI devices. Junction isolation is effective in blocking stray signals that propagate in the vicinity of the surface of the device. However, in ICs that are formed in epitaxial material, where the epitaxial layer is grown on a low resistivity substrate, an additional stray signal path extends vertically through the epi layer and into the low resistivity substrate. Once the signal reaches the substrate it can stray unimpeded to any region of the chip. A proposal for dealing with interference in the substrate is to increase the resistivity of the substrate. Silicon on sapphire (SOS) and similar technologies have been developed which provide a high degree of isolation, but these types of wafers are more difficult to process and are not economical for many applications.

Another approach to IC isolation that was explored in the early 1980s was the use of trenches between circuit components. V-groove trenches were found to consume excessive chip area. The advent of effective anisotropic plasma etching techniques, with which narrow trenches a few microns deep could be routinely formed, was also proposed for isolation. Techniques involving trenches of either kind required backfilling to allow further planar processing, and were, overall, complex and expensive.

Some of these approaches have been combined in principle to produce an isolation technique called triple well isolation. This approach uses a blanket subsurface implant which extends beneath multiple wells. Triple well isolation has been found to be efficient and cost effective. See "Simulation Techniques and Solutions for Mixed-Signal Coupling in Integrated Circuits" by Nishath K. Verghese, Timothy J. Schmerbeck and David J. Allstot, Second Edition, Kluwer Acedemic Publishers, 1995.

Recent advances in IC design and fabrication make possible the integration of analog and digital circuits on the same IC chip. However, the analog signals are susceptible to interference and the presence of digital signals, or high level analog signals which swing the full voltage range, in the vicinity of analog components allows the digital interference to couple directly into the analog sections of the IC chip. The use of triple well isolation in these ICs is ineffective since the isolation implant, which is typically tied to the voltage of the digital wells, i.e. the digital $V_{DD}$, actually couples directly the digital voltage swings into the analog wells.

Use of triple well regions within analog circuitry can be problematic even if the triple well region is tied to analog $V_{DD}$ because analog circuits usually contain isolated N regions containing p-channel devices that are meant to be tubbed to some node other than $V_{DD}$. Since all of the NTUB regions within a triple well region get connected together through the buried layer, existing analog circuitry would have to be redesigned to make it compatible with triple well. Thus, one advantage of the inventive scheme is that analog circuitry that was designed for an analog-only chip with no isolation scheme can be placed onto a mixed analog/digital chip without being redesigned.

SUMMARY OF THE INVENTION

We propose an isolation technique for analog/digital subcircuits in a single chip implementation which uses a relatively simple modification of the triple well isolation technique. Having recognized that in triple well isolated circuits using both digital and analog sections the triple well implant channels noise throughout the chip, the triple well deep implant in our modified isolation technique is selectively made just beneath the wells containing digital circuits. Thus only the portions of the chip that operate at digital $V_{DD}$ are isolated with the triple well implant.

DETAILED DESCRIPTION

Figure 1:
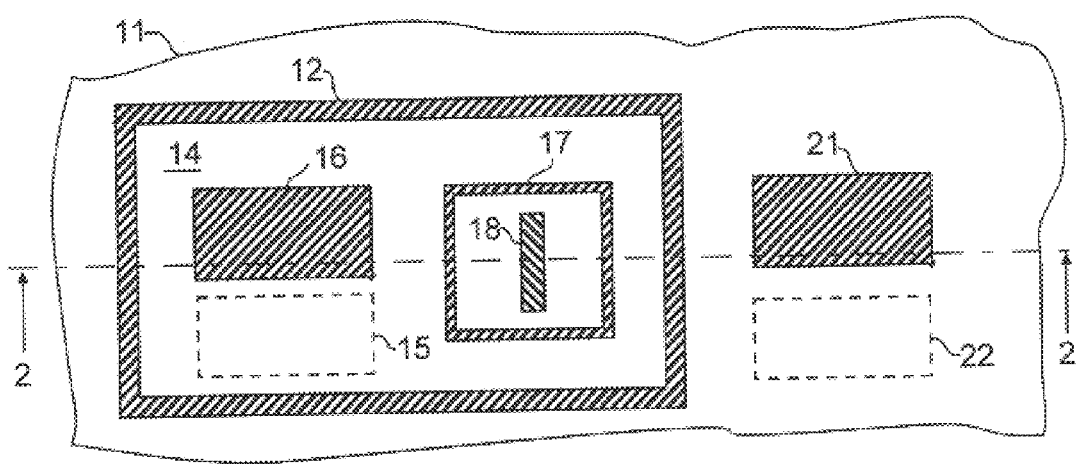
FIG. 1 is a plan view of a portion of an analog/digital multicircuit chip with selective triple well isolation according to the invention.

The use of selective triple well isolation according to the invention is shown in FIG. 1. A plan view of a portion of a combined analog/digital integrated circuit chip is shown at 11. In the arrangement of FIG. 1, the digital and analog circuit layout has a "noisy" subcircuit, i.e. digital circuit, formed in digital tub 14 and a "sensitive" subcircuit, i.e. analog circuit, formed at 21, 22 in the analog section. For convenience in illustrating the invention the actual transistor devices are not shown. Typically these comprise CMOS transistor arrays in both the digital tub and the analog tub. While the combination of analog and digital circuits is the most likely, and is chosen for illustration, the combination could also consist of or comprise analog circuit subsections with high level analog signal interference between them. The n-tub (usually n-material) implant for the digital devices is shown at 12, encircling p-region (substrate region) 14. A portion 15 of p-region 14 is dedicated to n-channel digital devices. N-tub 16 is provided for p-channel digital devices. The site 15 for the n-channel digital devices is shown located beside the n-tub 16, but other locations within p-region 14 are equally effective. The n-type triple well isolation region is tied to the digital $V_{DD}$. The n-tub 16 is also tied to the digital $V_{DD}$.

Also provided in the digital device section 14 is a site for an n-well resistor. In the typical digital circuit, many resistors are used. However, unlike the transistor devices in the digital section, the resistor cannot be tied to $V_{DD}$. Therefore resistor 18 is segregated from the triple well isolated regions by deep surface implant 17 but, as will be seen, the deep triple well subsurface implant is omitted from the resistor site. The resistor is effectively formed in substrate 11. The n-resistor is shown as a strip but may also be a serpentine n-type region. Resistor contacts (not shown) are formed at the ends of the resistor strip.

The analog devices are formed in p-type substrate regions shown in FIG. 1 to the right of the digital device region 14. The analog devices typically comprise CMOS transistor pairs, with the p-type transistors formed in n-tub 21 and the n-type transistors formed in the p-substrate at location 22. Again, other spatial configurations may be used. As shown in these figures the analog devices are formed directly in the p-substrate, which is acceptable if the doping level of the substrate is appropriate. If a different level of doping is desired for the analog device array, a p-tub may be provided.

Figure 2:
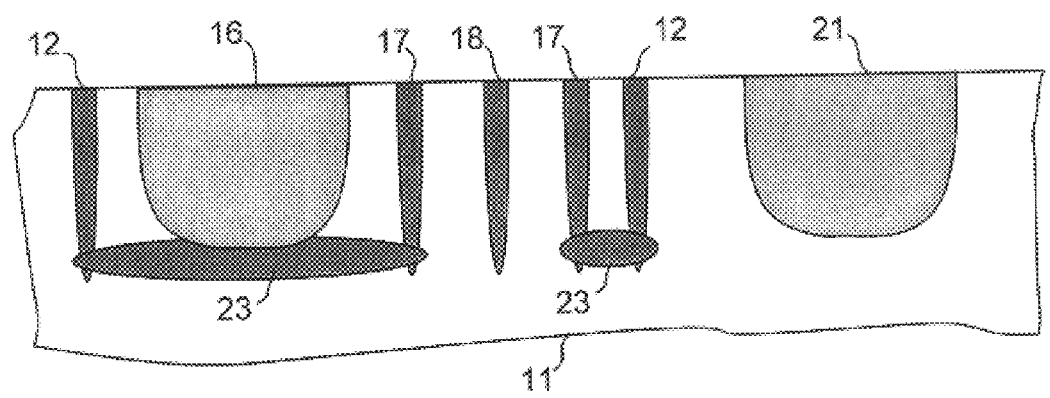
FIG. 2 is a sectional view through 2—2 of FIG. 1.

The triple well isolation regions can be seen in better perspective in FIG. 2, which is a section view through 2—2 of FIG. 1. The deep implant that completes the triple well isolation is shown at 23. The omission of a deep implant underneath resistor 18 in the digital device section is also evident.

It will be appreciated by those skilled in the art that the features in the drawings are not to scale. For example, the features incorporated in the substrate, e.g. impurity regions, are shown as having dimensions that are overly large compared with the thickness of the substrate. Accordingly, substrate 11 is shown broken to indicate that it extends substantially further down the page of the drawings. A typical silicon wafer may have a thickness of the order of 500 μm or more, while a conventional impurity region has a depth of less than 10% of that thickness.

Referring to FIG. 2, substrate 11 is a silicon substrate, only a portion of which is shown. The deep impurity region 23 can be formed by high energy ion implantation or by the so-called buried collector technique in which a selective surface implant is made for the isolation regions, and these regions are then "buried" by growing an epitaxial layer over the implanted wafer.

N-type wells 16 and 21 are formed by deep implants and drive in the conventional way. The n-wells are typically doped with phosphorus, and have a concentration in the range $10^{15}$–$10^{17}$/cm$^3$. They may be formed using an implant drive at 1000–1200° C. for 10–660 minutes. The depth of the wells may vary but should be deep enough to intersect the buried isolation region 23. A useful range for the depth of the isolation region below the wafer surface is 2–10 μm.

The p-wells 15 and 22 (FIG. 1) may use the substrate doping or may be more heavily doped using boron doping at a concentration of $10^{15}$–$10^{17}$/cm$^3$, and a drive at 1000–1200° C. for 10–660 minutes. The arrangement shown in FIG. 1, with alternating p-wells and n-wells is the usual case. However, complementary structures can also be formed with other sequences, e.g. multiple n-wells alternating with multiple p-wells. Techniques for forming complementary wells are well known to those skilled in the art and need not be described in detail here.

Figure 3:
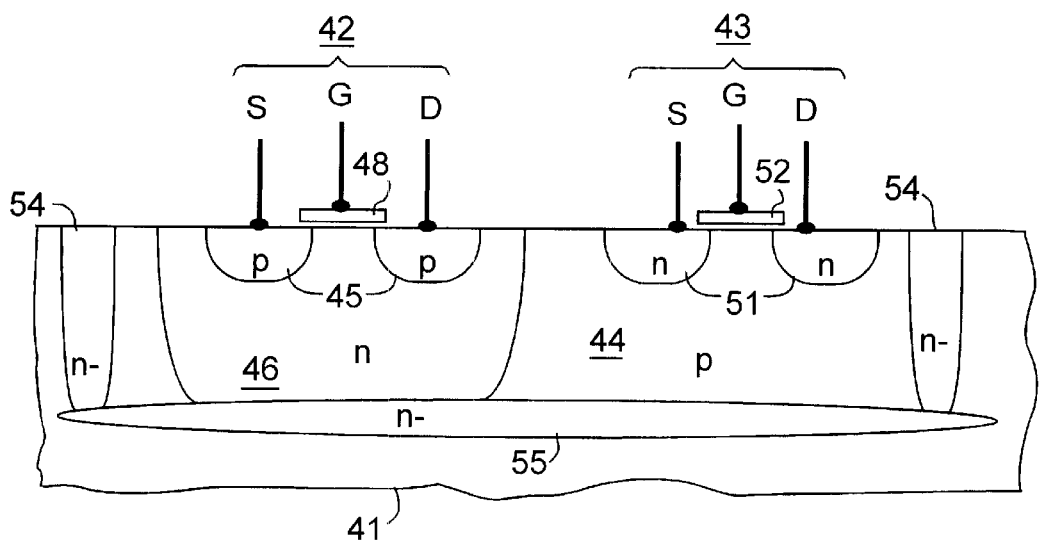
FIG. 3 is a schematic representation of the digital device array section of the mixed digital/analog chip.
Figure 4:
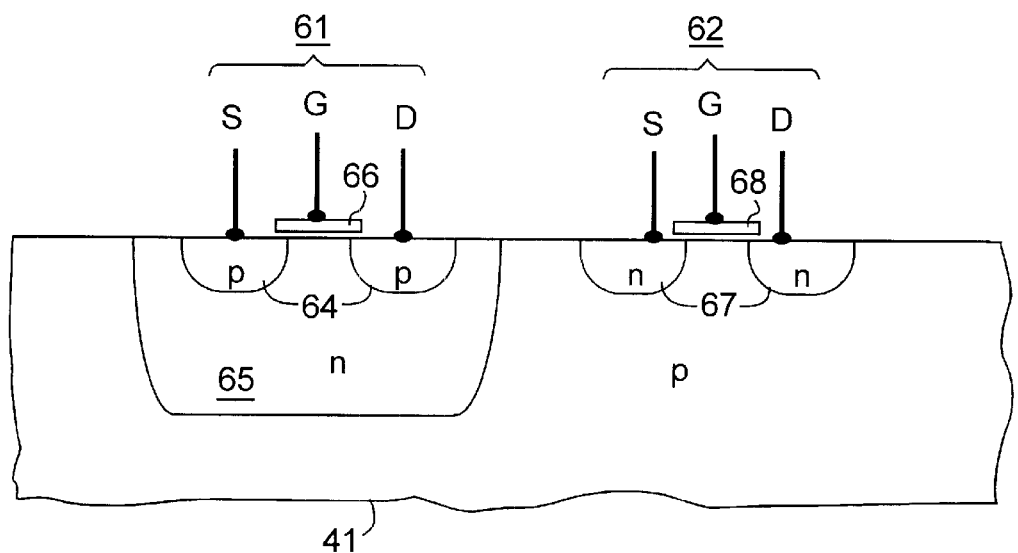
FIG. 4 is a schematic representation of the analog device array section of the mixed digital/analog chip.

The triple well isolation device of the invention is shown with more device detail in FIGS. 3 and 4, with the digital devices shown in FIG. 3, and the analog devices shown in FIG. 4. It should be understood that FIGS. 3 and 4 show parts of the same chip substrate 41. In FIG. 3, a pair of CMOS transistors for the digital circuit is shown formed in substrate 41, with the p-channel transistor at 42 and the n-channel transistor at 43. The source and drain p-regions 45 of transistor 42 are formed in n-tub 46, with the gate shown at 48. The corresponding complementary transistor 43 is shown here formed in isolated p-substrate region 44 with source and drain n-regions 51 and gate 52. The triple well isolation for the digital circuit comprises deep surface implants 54 and buried region 55.

The analog section of the chip is shown in FIG. 4, with p-channel transistor 61 and n-channel transistor 62 formed in substrate 41. The p-channel transistor has p-type source and drain regions 64 formed in n-tub 65, with the gate at 66. The corresponding n-channel device is shown with n-type source and drain regions 67, and gate 68. These devices are made by the steps of forming the silicon gate over selected n-wells and p-wells or substrate regions, and implanting the source and drain regions as shown. Suitable doping levels for source and drain regions is in the range $10^{18}$–$10^{20}$/cm$^3$.

It will be apparent to those skilled in the art that complementary elements of the device structure can be exchanged with regard to impurity type.

Figure 5:
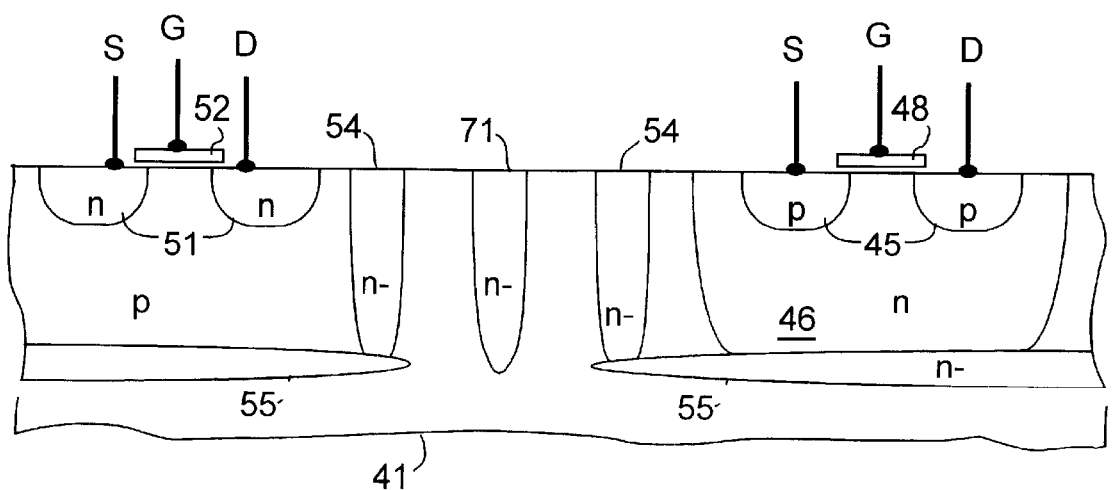
FIG. 5 is a schematic representation of the digital device array section of the mixed digital/analog chip showing an n-well resistor integrated in the digital device array section.

As indicated earlier, the digital circuits frequently include n-well resistors that are simple strip resistors formed of n-well (usually n$^-$) material. However, it is important that they, unlike the digital transistors, be isolated from the digital $V_{DD}$. Consequently they should be formed in the same manner as the analog devices, i.e. separated from the deep triple well isolation implant. This is illustrated in FIG. 5, where resistor 71 is formed in digital device section, i.e. with digital devices on both sides, but where the deep isolation implant 55 does not extend beneath the resistor 71. For convenience, the n-region for the resistor may be formed in the same step as the surface implants for the triple well isolation, in which case the resistor implant resembles the surface triple well implants 54 as shown in FIG. 5.

As is well known, the digital devices operate with a switched voltage that swings the full range at each operation from the on state to the off state, i.e. the digital drive voltage $V_D$ steps from a first value $V_{D1}$, to a second value $V_{D2}$. The triple well isolation regions are tied to this voltage, $V_D$. The analog devices operate using voltage which is designated "$V_A$" here and in the appended claims, and may vary over a range of voltages between values $V_{A1}$ and $V_{A2}$. The reference voltage for the drive voltages, i.e. $V_{SS}$, are tied to the p-type substrate, in both sections, i.e. digital $V_{SS}$ is tied to region 14 in FIG. 1, and analog $V_{SS}$ is tied to substrate 11.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A mixed analog/digital integrated circuit comprising:
   (a) a silicon substrate having a surface,
   (b) a digital device section in the substrate, the digital device section comprising an array of MOS transistors operating at a voltage $V_D$ that steps from a first value $V_{D1}$, to a second value $V_{D2}$,
   (c) a p-n junction guard ring surrounding the digital device section, the guard ring comprising impurity regions extending from the surface of the substrate to a depth of at least d below the surface of the substrate,
   (d) an analog device section in the substrate spaced laterally from the digital device section, the analog device section comprising an array of MOS transistors operating with a voltage $V_A$ that varies continuously from $V_{A1}$ to $V_{A2}$,
   (e) a triple well isolation region comprising an implanted layer that extends beneath the digital device region at a depth d and contacts the p-n junction guard ring, and wherein the analog device section is devoid of triple well isolation region.

2. The integrated circuit of claim 1 wherein the array of MOS transistors in the digital device section comprise pairs of CMOS transistors.

3. The integrated circuit of claim 2 wherein the array of MOS transistors in the analog device section comprise pairs of CMOS transistors.

4. The integrated circuit of claim 1 wherein d is in the range 2–10 microns.

5. The mixed analog/digital integrated circuit of claim 1 additionally comprising at least one resistor element electrically interconnected to said digital device section and wherein the resistor element is devoid of triple well isolation region.

6. An integrated circuit formed in a p-type silicon substrate and comprising:
(a) a digital device section, the digital device section having a first region, a second region and a third region and comprising:
(i) an n-well formed in the first region of the digital device section,
(ii) at least one p-channel transistor formed in the first n-well,
(iii) means for applying to the p-channel transistor a voltage $V_D$ that steps from a first value, $V_{D1}$, to a second value, $V_{D2}$,
(iv) at least one n-channel transistor formed in the second region of the digital device section,
(v) means for applying to the n-channel transistor a voltage $V_D$ that steps from a first value, $V_{D1}$, to a second value, $V_{D2}$,
(vi) at least one n-well resistor formed in the third region of the digital device section,
(b) an analog device section, the analog section comprising a first region, and a second region, and comprising:
(i) an n-well formed in the first region of the analog device section,
(ii) at least one p-channel transistor formed in the first n-well,
(iii) means for applying to the p-channel transistor a voltage $V_A$ that varies over a range of voltages between a first value, $V_{A1}$, and a second value, $V_{A2}$,
(iv) at least one n-channel transistor formed in the second region of the analog device section,
(v) means for applying to the n-channel transistor a voltage $V_A$ that varies over a range of values between a first value, $V_{A1}$, and a second value, $V_{A2}$,
(c) means for connecting the first and second regions of the digital device section to digital $V_{SS}$,
(d) means for connecting the first and second regions of the analog device section, and the third region of the digital device section to analog $V_{SS}$,
(e) a first n-type guard ring surrounding the first, second, and third regions of the digital device section, the first n-type guard ring extending from the surface of the substrate to a depth of at least d below the surface of the substrate,
(f) a second n-type guard ring surrounding the third region of the digital device section, the second n-type guard ring situated within, and spaced from, the first n-type guard ring and extending from the surface of the substrate to a depth of at least d below the surface of the substrate,
(g) an n-type triple well isolation region selectively formed at a depth d underneath said first and second regions of the digital device section and joined to the first and second n-type guard rings.

7. The integrated circuit of claim 6 wherein d is in the range 2–10 microns.

8. An integrated circuit formed in an n-type silicon substrate and comprising:
(a) a digital device section, the digital device section having a first region, a second region and a third region and comprising:
(i) a p-well formed in the first region of the digital device section,
(ii) at least one n-channel transistor formed in the first p-well,
(iii) means for applying to the n-channel transistor a voltage $V_D$ that steps from a first value, $V_{D1}$, to a second value, $V_{D2}$,
(iv) at least one p-channel transistor formed in the second region of the digital device section,
(v) means for applying to the p-channel transistor a voltage $V_D$ that steps from a first value, $V_{D1}$, to a second value, $V_{D2}$,
(vi) at least one p-well resistor formed in the third region of the digital device section,
(b) an analog device section, the analog section comprising a first region, and a second region, and comprising:
(i) a p-well formed in the first region of the analog device section,
(ii) at least one n-channel transistor formed in the first p-well,
(iii) means for applying to the n-channel transistor a voltage $V_A$ that varies over a range of voltages between a first value, $V_{A1}$, and a second value, $V_{A2}$,
(iv) at least one p-channel transistor formed in the second region of the analog device section,
(v) means for applying to the p-channel transistor a voltage $V_A$ that varies over a range of values between a first value, $V_{A1}$, and a second value, $V_{A2}$,
(c) means for connecting the first and second regions of the digital device section to digital $V_{DD}$,
(d) means for connecting the first and second regions of the analog device section, and the third region of the digital device section to analog $V_{DD}$,
(e) a first p-type guard ring surrounding the first, second, and third regions of the digital device section, the first p-type guard ring extending from the surface of the substrate to a depth of at least d below the surface of the substrate,
(f) a second p-type guard ring surrounding the third region of the digital device section, the second p-type guard ring situated within, and spaced from, the first p-type guard ring and extending from the surface of the substrate to a depth of at least d below the surface of the substrate,
(g) a p-type triple well isolation region selectively formed at a depth d underneath said first and second regions of the digital device section and joined to the first and second p-type guard rings.

* * * * *